(12) United States Patent
Kobayashi (10) Patent No.: US 8,237,512 B2
(45) Date of Patent: Aug. 7, 2012

(54) DIGITALLY CONTROLLED OSCILLATOR AND OSCILLATION METHOD FOR THE SAME

(75) Inventor: Hiroyuki Kobayashi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 47 days.

(21) Appl. No.: 12/885,784

(22) Filed: Sep. 20, 2010

(65) Prior Publication Data

US 2011/0234326 A1    Sep. 29, 2011

(30) Foreign Application Priority Data

Mar. 25, 2010    (JP) .................................. 2010-069847

(51) Int. Cl.
*H03L 7/099* (2006.01)

(52) U.S. Cl. .................. 331/1 A; 331/36 C; 331/117 R; 331/179; 375/373

(58) Field of Classification Search ............... 331/1 A, 331/16, 17, 34, 36 C, 117 FE, 117 R, 167, 331/179, 185; 327/147, 156; 375/373–376
See application file for complete search history.

(56) References Cited

U.S. PATENT DOCUMENTS

| | | | | |
|---|---|---|---|---|
| 6,310,653 B1 * | 10/2001 | Malcolm et al. | ............... | 348/537 |
| 6,606,004 B2 * | 8/2003 | Staszewski et al. | ............. | 331/17 |
| 6,658,748 B1 * | 12/2003 | Leipold et al. | ................ | 331/179 |
| 6,734,741 B2 * | 5/2004 | Staszewski et al. | ......... | 331/36 C |
| 6,747,522 B2 * | 6/2004 | Pietruszynski et al. | ... | 331/177 R |
| 6,838,951 B1 * | 1/2005 | Nieri et al. | ................ | 331/177 V |
| 7,439,817 B2 * | 10/2008 | Waheed et al. | .................. | 331/16 |
| 7,483,508 B2 * | 1/2009 | Staszewski et al. | ........... | 375/376 |
| 7,675,370 B2 * | 3/2010 | Sun et al. | ......................... | 331/44 |
| 7,719,371 B2 * | 5/2010 | Pernia et al. | .................... | 331/78 |
| 7,902,933 B1 * | 3/2011 | Brennan | ....................... | 331/158 |
| 2005/0231240 A1 * | 10/2005 | Goldfarb et al. | ............... | 327/105 |

FOREIGN PATENT DOCUMENTS

| | | |
|---|---|---|
| JP | 02-002719 | 1/1990 |
| JP | 02-280414 | 11/1990 |
| JP | 2000-022523 | 2/2000 |

OTHER PUBLICATIONS

Chen et al, A Calibration-Free 800MHz Fractional-N Digital PLL with Embedded TDC, IEEE International Solid State Circuits Conference, 2010.
Staszewski et al, Phase-Domain All-Digital Phase-Locked Loop, IEEE Trans. Circuits Syst. 11, vol. 52, No. 3, Mar. 2005 pp. 159-163.

* cited by examiner

*Primary Examiner* — Levi Gannon
(74) *Attorney, Agent, or Firm* — Turocy & Watson, LLP (57) ABSTRACT

According to an embodiment, a digitally controlled oscillator outputs an oscillation signal having an oscillation frequency according to an oscillator tuning word. The digitally controlled oscillator includes a control unit and an oscillator. The control unit divides the oscillator tuning word of N bits into upper (N−A) (A≧1 and N>A) bits and lower A bits, converts the upper (N−A) bits into a first code to perform Binary control of (N−A) bits and converts the lower A bits into a second code to perform Unary control of (2^(A+1)−2) bits, and outputs the conversion results, and the oscillator outputs oscillation signals having oscillation frequencies according to the first and second codes output from the control unit.

10 Claims, 7 Drawing Sheets

| TIME | OTW [7:0] | OTWb [7:3] | | | | | OTWu [13:0] | | | | | | | | | | | | | |
|---|---|---|---|---|---|---|---|---|---|---|---|---|---|---|---|---|---|---|---|---|
| T1 | 23 | 0 | 0 | 0 | 1 | 0 | 1 | 1 | 1 | 1 | 1 | 1 | 1 | 1 | 1 | 1 | 1 | 1 | 1 | 1 |
| T2 | 24 | 0 | 0 | 0 | 1 | 1 | 0 | 0 | 0 | 0 | 0 | 0 | 0 | 1 | 1 | 1 | 1 | 1 | 1 | 1 |
| T3 | 23 | 0 | 0 | 0 | 1 | 1 | 0 | 0 | 0 | 0 | 0 | 0 | 0 | 1 | 1 | 1 | 1 | 1 | 1 | 1 |

DIGITALLY CONTROLLED OSCILLATOR AND OSCILLATION METHOD FOR THE SAME

CROSS-REFERENCE TO RELATED APPLICATIONS

This application is based upon and claims the benefit of priority from Japanese Patent Application No. 2010-069847, filed on Mar. 25, 2010; the entire contents of which are incorporated herein by reference.

FIELD

Embodiments described herein relate generally to a digitally controlled oscillator and an oscillation method for the same.

BACKGROUND

In recent years, in wireless communication apparatuses, such as wireless LAN apparatuses, an all digital PLL (AD-PLL) circuit that converts all control signals of a phase locked loop (PLL) circuit into digital signals is used. Since the ADPLL circuit replaces an analog circuit by a digital circuit, space saving and power saving are enabled by the progress of a process.

The ADPLL circuit includes a digital loop filter, a digitally controlled oscillator (DCO), a counter, and a time-to-digital converter (TDC). The counter counts an output CKV of the DCO and outputs a count value CNTV, based on a reference signal REF synchronized with the output CKV of the DCO. The TDC extracts the phase difference d of one cycle of the output CKV of the DCO or less, in synchronization with the reference signal REF. A comparison result (difference) between a value, which is obtained by adding the count value CNTV and the phase difference d, and a phase control signal is provided to the digital loop filter. An oscillation frequency of the DCO is controlled based on an output of the digital loop filter.

When the DCO is controlled, frequency control methods of a Unary control type (for example, refer to "Mike Shuo-Wei Chen, Davis Su, Srenik Mehta "26.3 A Calibration-Free 800 MHz Fractional-N Digital PLL with Embedded TDC", 2010 IEEE International Solid-State Circuits Conference") and a Binary control type are used. In the Unary control type, since the number of control lines increases, consumption power and a mounting area increase. In the Binary control type, at a change point of upper bits, switching noise may be easily generated due to a variation in parasitic capacitance or a transistor characteristic.

DETAILED DESCRIPTION

In general, according to embodiments, a digitally controlled oscillator that outputs an oscillation signal having an oscillation frequency according to an oscillator tuning word, includes a control unit that divides the oscillator tuning word of N bits into upper (N−A) (A≧1 and N>A) bits and lower A bits, converts the upper (N−A) bits into a first code to perform Binary control of (N−A) bits and converts the lower A bits into a second code to perform Unary control of (2^(A+1)−2) bits, and outputs the conversion results; and an oscillator that outputs oscillation signals having oscillation frequencies according to the first and second codes output from the controller.

Exemplary embodiments of a digitally controlled oscillator and an oscillation method for the same will be described below in detail with reference to the attached drawings. The invention is not limited by the embodiments.

Figure 1:
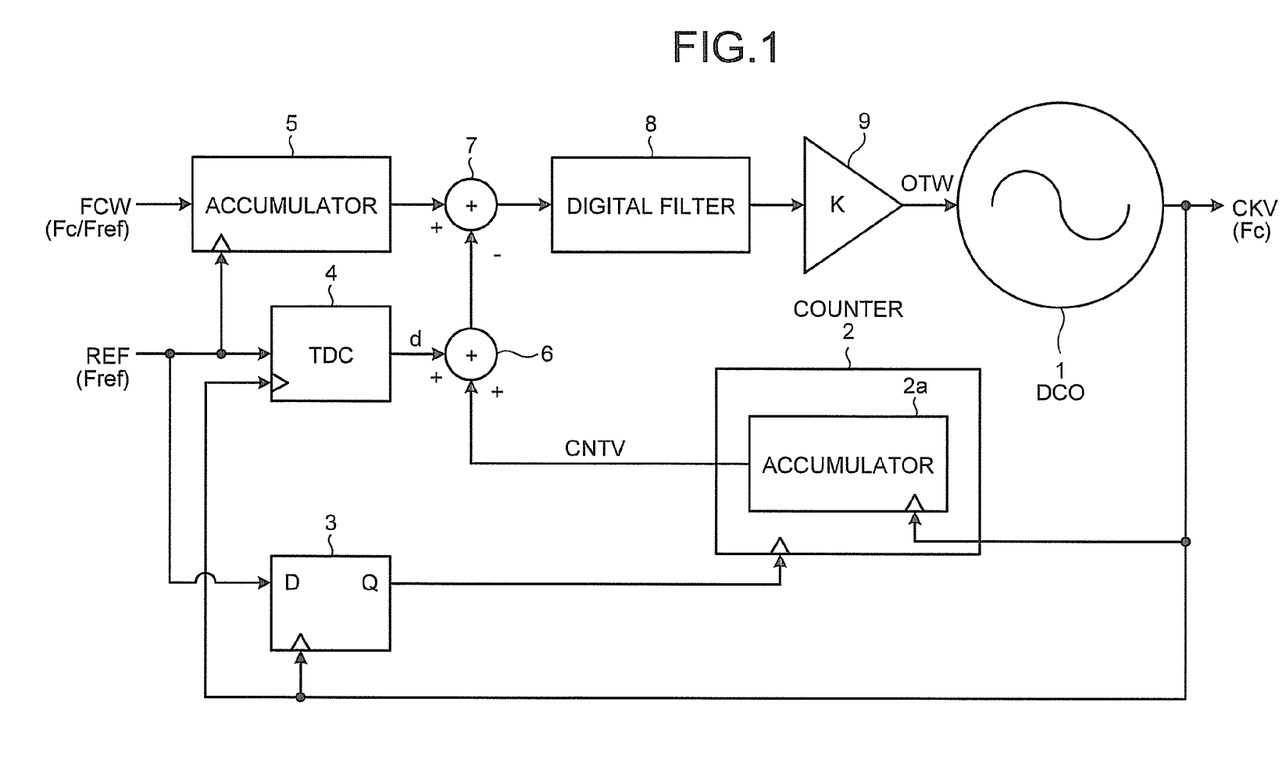
FIG. 1 is a block diagram illustrating a basic configuration of an ADPLL where a DCO according to a first embodiment is applied.

First Embodiment:

FIG. 1 is a block diagram illustrating a basic configuration of an ADPLL where a DCO according to this embodiment is applied. First, the configuration and operation of the ADPLL will be simply described with reference to FIG. 1. The ADPLL shown in FIG. 1 includes a DCO 1 corresponding to an oscillator and a control unit 10. The control unit 10 includes a counter 2, a flip-flop 3 that corresponds to a re-timing circuit, a TDC 4, an accumulator 5, adders 6 and 7 that constitute a digital phase comparator, a digital filter 8 that functions as a loop filter, and a gain corrector 9.

The DCO 1 outputs an oscillation signal CKV having a frequency Fc that is indicated by an oscillator tuning word (OTW) input from the gain corrector 9. The flip-flop 3 receives a reference signal (REF), which is input from the outside to a data input terminal D, in synchronization with the oscillation signal CKV output by the DCO 1, and outputs the synchronized reference signal REF from a data output terminal Q.

The counter 2 includes an accumulator 2a that accumulates a cycle number of the oscillation signal CKV output by the DCO 1, and outputs an integration value CNTV of the accumulator 2a when the reference signal REF synchronized with the oscillation signal CKV, which is output by the flip-flop 3, is input to one addition input terminal of the adder 6.

The TDC 4 includes a delay circuit that delays the oscillation signal CKV of the DCO 1 with multiple stages, plural flip-flops that receive an output of each delay stage of the delay circuit in synchronization with the reference signal REF input from the outside, and a circuit that generates phase information of one cycle of the oscillation signal CKV or less from output states of the plural flip-flops, and the TDC 4 outputs the generated phase information d of one cycle or less to the other addition input terminal of the adder 6.

The adder 6 uses the integration value CNTV from the counter 2 as an integral part and the phase information d of one cycle or less from the TDC 4 as a decimal part and adds the integration value and the phase information. The addition result of the adder 6 as phase information standardized by a frequency Fref of the reference signal REF is provided to a subtraction input terminal of the adder 7. An output of the accumulator 5 is input to an addition input terminal of the adder 7.

The accumulator 5 receives, from the outside, a ratio "Fc/Fref" of the oscillation frequency Fc of the DCO 1 functioning as a frequency command word (FCW) to the frequency Fref of the reference signal REF, and also receives the reference signal REF. The accumulator 5 temporally integrates the ratio "Fc/Fref" and converts the ratio into phase information, and outputs the phase information of when the reference signal REF is input as phase control information to the addition input terminal of the adder 7.

The adder 7 performs subtraction between the phase control information from the accumulator 5 and the phase information from the adder 6, and generates phase error information. The digital filter 8 that is a loop filter executes low-pass filtering on the phase error information output by the adder 7 and generates a control value with respect to the DCO 1. The gain corrector 9 multiplies the control value generated by the digital filter 8 by a coefficient K and generates the oscillator tuning word OTW where the control value of the DCO 1 is corrected by the frequency gain. By repeating the above operation, the oscillation frequency of the DCO 1 is controlled such that Fc=n×Fref is realized, when the ratio "Fc/Fref" is set to be n.

Figure 2:
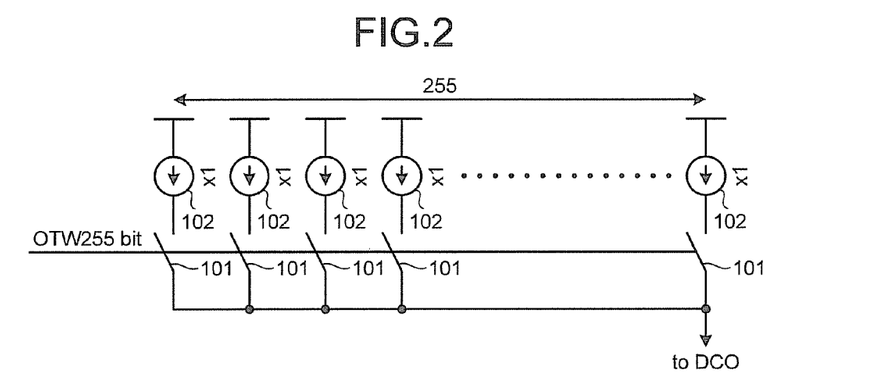
FIG. 2 is a diagram schematically illustrating a switching mechanism of when conventional Unary control (255 bits) is performed on the DCO.
Figure 3:
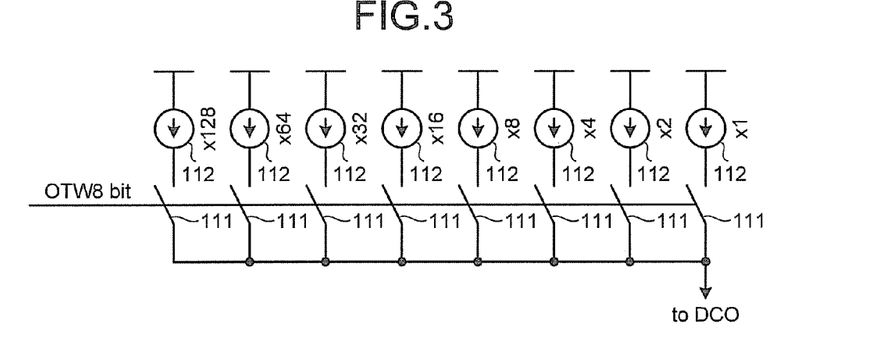
FIG. 3 is a diagram schematically illustrating a switching mechanism of when conventional Binary control (8 bits) is performed on the DCO.

The DCO 1 according to this embodiment will be described in detail with reference to FIGS. 2 to 8, while comparing the embodiment with the related art. FIG. 2 schematically illustrates a switching mechanism of when conventional Unary control (255 bits) is performed on the DCO. FIG. 3 schematically illustrates a switching mechanism of when conventional Binary control (8 bits) is performed on the DCO.

When the DCO is controlled by 255 values, that is, in the case of the Unary control, as shown in FIG. 2, since the OTW is set as 255 bits and 255 switches 101 and 255 constant current sources 102 are needed, the number of control lines increases and consumption power and a mounting area may increase. Meanwhile, in the case of the Binary control, as shown in FIG. 3, since the OTW is set as 8 bits and 8 switches 111 and 8 constant current sources 112 that respectively multiply a reference current by 128, 64, 32, 16, 8, 4, 2, and 1 are needed, the number of control lines can be greatly decreased. However, at a change point of upper bits, switching noise of the switches may be easily generated due to a variation in parasitic capacitance or a transistor characteristic.

Figure 4:
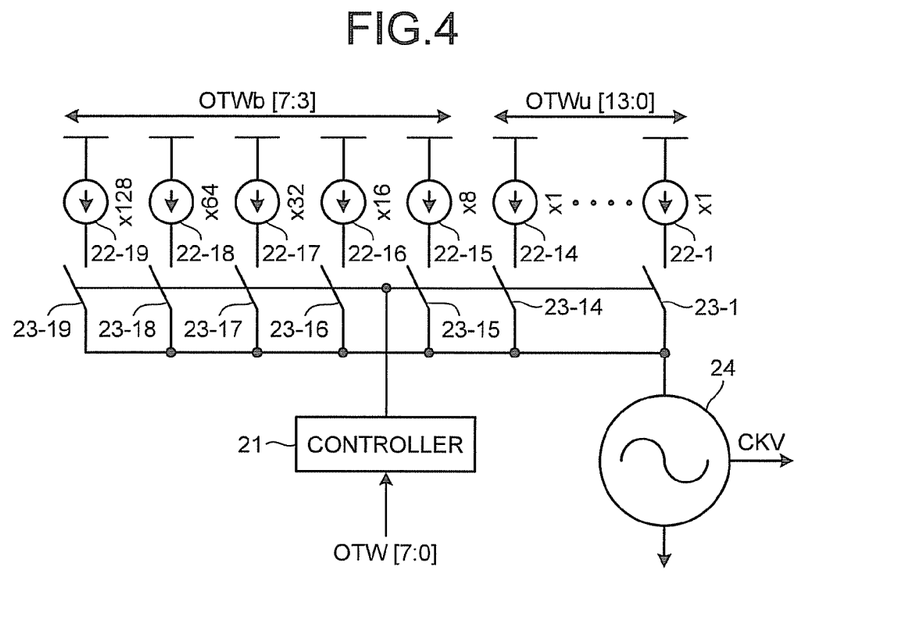
FIG. 4 is a diagram illustrating an example of the schematic configuration of the DCO according to the first embodiment.
Figure 5:
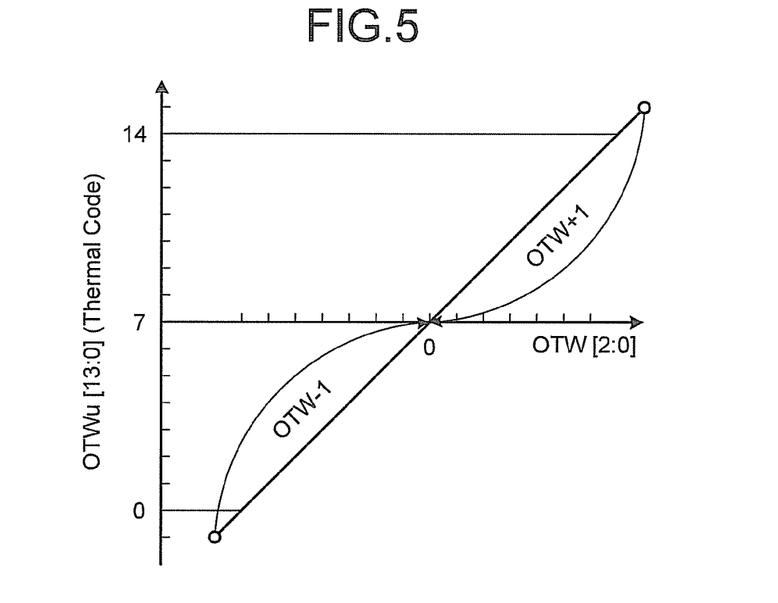
FIG. 5 is a diagram illustrating a correspondence relationship between OTW [2:0] and OTWu [13:0]
Figure 6:
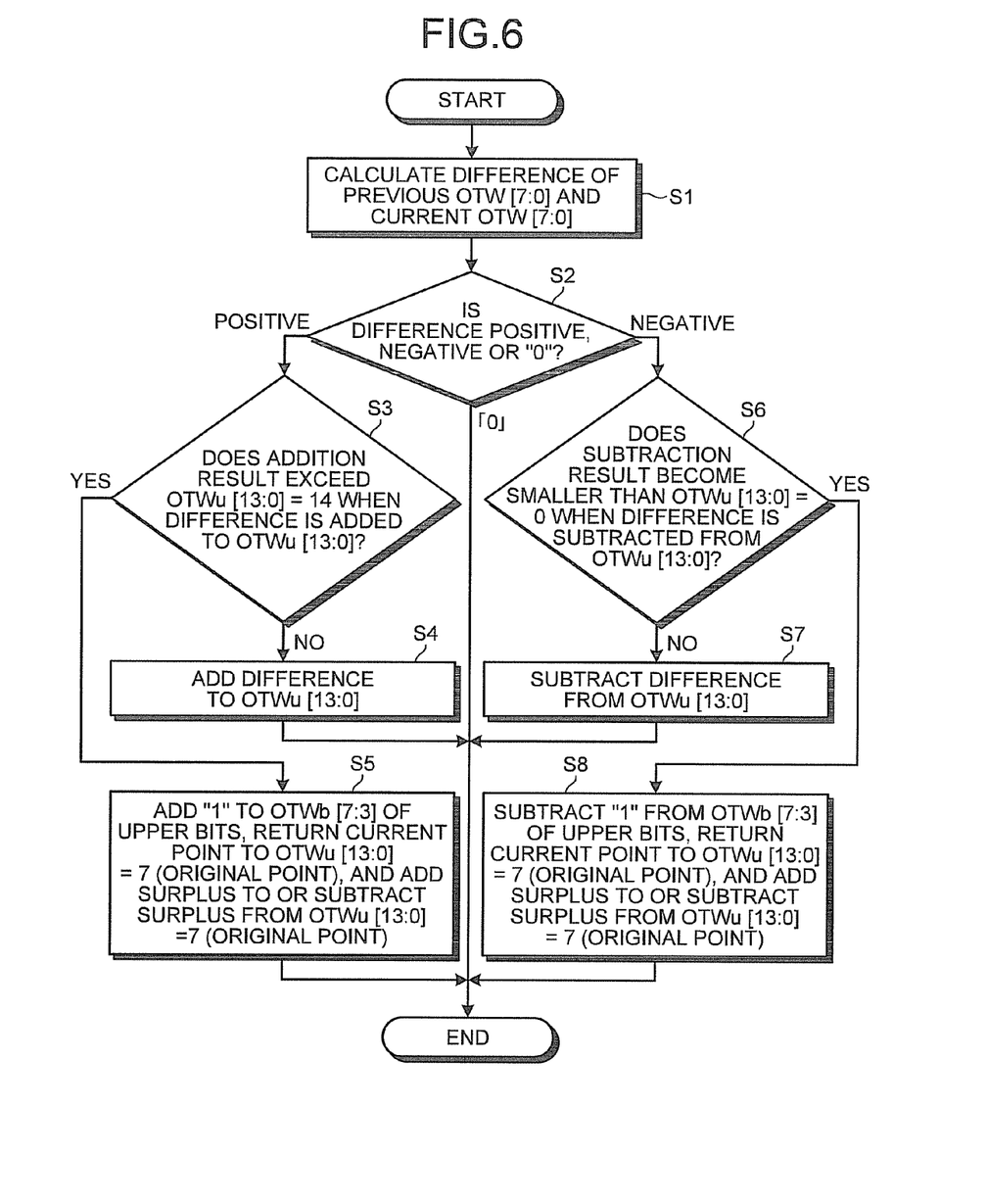
FIG. 6 is a flowchart illustrating data conversion based on a controller.
Figure 7:
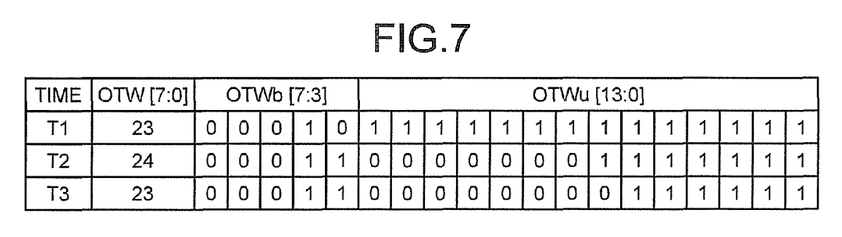
FIG. 7 is a diagram illustrating a specific example of OTW, OTWb [7:3] and OTWu [13:0]
Figure 8A:
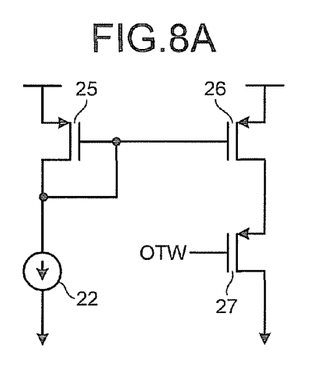
FIGS. 8A and 8B are diagrams illustrating an example of the configuration of a switch.
Figure 8B:
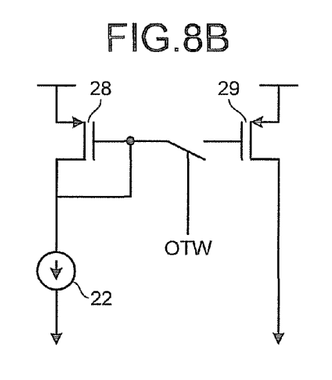

Accordingly, in this embodiment, in order to decrease the number of control lines and the switching noise of the upper bits, the following configuration is adopted. FIG. 4 illustrates an example of the schematic configuration of the DCO 1 according to the first embodiment. FIG. 5 illustrates a correspondence relationship between OTW [2:0] and OTWu [13:0]. FIG. 6 is a flowchart illustrating data conversion based on a controller. FIG. 7 illustrates a specific example of OTW [7:0], OTWb [7:3] and OTWu [13:0]. FIGS. 8A and 8B illustrate an example of the configuration of a switch.

In this embodiment, an oscillator tuning word (OTW) of 8 bits is divided into upper 5 bits and lower 3 bits, and the upper 5 bits are converted into OTWb (first code) to perform Binary control of 5 bits and the lower 3 bits are converted into OTWu (second code) to perform Unary control of 14 bits. As a result, the switching noise of upper bits is decreased while the number of control lines is decreased.

As shown in FIG. 4, the DCO 1 includes a controller 21, 19 reference current sources 22-1 to 22-19, 19 switches 23-1 to 23-19, and an oscillator 24. The controller 21 converts OTW [7:0] input from the gain corrector 9 into a control signal OTWb [7:3] and a thermometer code with offset OTWu [13:0] and turns on/off the switches 23-1 to 23-19. The upper 5 bits of the OTW [7:0] are expressed as OTWb [7:3], and the lower 3 bits OTW [2:0] of the OTW [7:0] are expressed as OTWu [13:0]. Even when the upper bits are expressed using the thermometer codes, the same process as the above process can be executed.

The reference current sources 22-1 to 22-19 are connected in series to the switches 23-1 to 23-19, respectively, and the reference current sources 22-19 to 22-15 output currents that are obtained by multiplying the reference current by 128, 64, 32, 16, and 8, respectively, and the 14 reference current sources 22-14 to 22-1 output the reference current. The 5 switches 23-19 to 23-15 are switched by the OTWb [7:3] and the 14 switches 23-14 to 23-1 are switched by the OTWu [13:0].

In this embodiment, the OTW [7:0] of 8 bits is divided into OTW [7:3] of upper 5 bits and OTW [2:0] of lower 3 bits. The Binary control is performed on the OTW [7:3] of upper 5 bits. The bits of the OTWb [7:3] that corresponds to the OTW [7:3] of upper 5 bits are input to the 5 switches 23-19 to 23-15, respectively, and reference currents that are obtained by multiplying the reference current by 128, 64, 32, 16, and 8 are supplied from the corresponding 5 reference current sources 22-19 to 22-15 to the oscillator 24, respectively, according to an ON/OFF state.

The OTW [2:0] of lower 3 bits is expressed as the OTWu [13:0]. When the Unary control is performed on the OTW [2:0], the OTW [2:0] can be generally expressed as the OTWu [6:0]. However, in this embodiment, the OTW [2:0] of lower 3 bits is expressed as the OTWu [13:0], such that states of the switches 23-19 to 23-15 for upper 5 bits are not changed, when a value of the OTW [7:0] is switched. Each bit of the OTWu [13:0] that corresponds to the OTW [2:0] of lower 3 bits are input to the 14 switches 23-14 to 23-1, respectively, and the reference current is supplied from the corresponding 14 reference current sources 22-14 to 22-1 to the oscillator 24, according to the ON/OFF state.

FIG. 5 illustrates a correspondence relationship between OTW [2:0] and OTWu [13:0]. In FIG. 5, a horizontal axis indicates the OTW [2:0] and the vertical axis indicates OTWu [13:0]. When the OTW [2:0] of lower 3 bits is "0" (original point), the OTWu [13:0] is set to become "7". In this case, "7" indicates 7 thermometer codes. When the OTWu [13:0] exceeds "14", the current point returns to the original point, and the difference is added to or subtracted from the original point. Meanwhile, when the OTWu [13:0] becomes smaller than "0", the current point returns to the original point, and the difference is added to or subtracted from the original point.

FIG. 6 is a flowchart illustrating data conversion based on the controller 21. In FIG. 6, the controller 21 calculates the difference of the previous OTW [7:0] and the current OTW [7:0] (step S1). Next, the controller 21 determines whether the difference is positive, negative or "0" (step S2). In the case where the difference is positive, the controller 21 determines whether an addition result exceeds OTWu [13:0]=14 when the difference is added to the OTWu [13:0] (step S3). When it is determined that the addition result does not exceed OTWu [13:0]=14 ("No" in step S3), the controller 21 adds the difference to the OTWu [13:0] (step S4). When it is determined that the addition result exceeds OTWu [13:0]=14 ("Yes" in step S3), the controller 21 adds "1" to OTWb [7:3] of upper bits, returns the current point to OTWu [13:0]=7 (original point), and adds only a surplus to or subtracts only a surplus from OTWu [13:0]=7 (original point) (step S5). In this case, when the surplus exceeds "14", the same process is repeated.

Meanwhile, in the case where the difference is negative, the controller 21 determines whether a subtraction result becomes smaller than OTWu [13:0]=0 when the difference is subtracted from the OTWu [13:0] (step S6). When it is determined that the subtraction result does not become smaller than OTWu [13:0]=0 ("No" in step S6), the controller 21 subtracts the difference from the OTWu [13:0] (step S7). When it is determined that the subtraction result becomes smaller than OTWu [13:0]=0 ("Yes" in step S6), the controller 21 subtracts "1" from OTWb [7:3] of upper bits, returns the current point to OTWu [13:0]=7 (original point), and adds only a surplus to or subtracts only a surplus from OTWu [13:0]=7 (original point) (step S8). In this case, when the surplus is less than "0", the same process is repeated.

A specific example of the above flow will be described with reference to FIG. 7. At time T1, it is assumed that OTWb [7:3]=[00010] and OTWu [13:0]=OTWu [11111111111111] are realized at OTW [7:0]=23. At time T2, when OTW [7:0]=23 increases by "1" to become OTW [7:0]=24, the difference of the previous OTW [7:0] and the current OTW [7:0] is "1" at "positive". For this reason, when the difference is added to the OTWu [13:0], the addition result exceeds OTWu [13:0]=14 ("Yes" in step S3). Therefore, "1" is added to OTWb [7:3] of upper bits, OTWb [7:3]=[00011] is obtained, OTWu [13:0]=OTWu [11111111111111] becomes OTWu [13:0]=[00000001111111], and the surplus becomes "0" (step S5).

Next, at time T3, when OTW [7:0]=24 returns to OTW [7:0]=23, the difference of the previous OTW [7:0] and the current OTW [7:0] is "negative". For this reason, when the difference "1" is subtracted from OTWu [13:0], the subtraction result does not become smaller than OTWu [13:0]=0 ("No" in step S6). Therefore, the difference is subtracted from OTWu [13:0] and OTWu [13:0]=[00000000111111] is obtained (step S7).

Since the lowermost bit of OTWb [7:3] does not change between the times T2 and T3, the switch 23-15 is turned on, and the switching noise of the switch of the Binary portion can be prevented.

By controlling the lower bits using the above method, in a situation where the shift of the upper bits is generated by ±1, continuous generation of the shift of the upper bits can be decreased, and an influence caused by the shift of the Binary control portion can be suppressed. Thereby, the shift probability of the Binary portion can be decreased while the Binary control is used, and a noise characteristic can be improved.

FIGS. 8A and 8B illustrate an example of the circuit configuration of a current source 22 and a switch 23. A switch shown in FIG. 8A is a switch circuit using a pMOS transistor 27 and a current-mirror circuit composed of pMOS transistors 25 and 26. A switch shown in FIG. 8B is a current-mirror circuit using two pMOS transistors 28 and 29. Since both the circuits are known circuits, the detailed description thereof is omitted.

As described above, according to the first embodiment, OTW [7:0] of 8 bits is divided into upper 5 bits and lower 3 bits, the upper 5 bits are converted into OTWb [7:3] to perform Binary control of 5 bits and the lower 3 bits are converted into OTWu [13:0] to perform Unary control, and the oscillation frequency of the oscillator is controlled. Therefore, the switching noise that is generated by the frequency control can be reduced, the control lines can be reduced, and the consumption power and the mounting area can be reduced.

The controller 21 calculates the difference of the previous OTW [7:0] and the current OTW [7:0]. In the case where the difference is positive, the controller 21 determines whether an addition result exceeds OTWu [13:0]=14 when the difference is added to OTWu [13:0]. When it is determined that the addition result does not exceed OTWu [13:0]=14, the controller 21 adds the difference to OTWu [13:0]. When it is determined that the addition result exceeds OTWu [13:0]=14, the controller 21 adds "1" to OTWb [7:3] of upper bits, returns the current point to OTWu [13:0]=7 (original point), and adds a surplus to or subtracts a surplus from OTWu [13:0]=7 (original point). Meanwhile, in the case where the difference is negative, the controller 21 determines whether the subtraction result becomes smaller than OTWu [13:0]=0 when the difference is subtracted from OTWu [13:0]. When it is determined that the subtraction result does not become smaller than OTWu [13:0]=0, the controller 21 subtracts the difference from OTWu [13:0]. When it is determined that the subtraction result becomes smaller than OTWu [13:0]=0, the controller 21 subtracts "1" from OTWb [7:3] of upper bits, returns the current point to OTWu [13:0]=7 (original point), and adds only a surplus to or subtracts only a surplus from OTWu [13:0]=7 (original point). Therefore, the switching of the switches of upper 5 bits can be reduced and the switching noise can be reduced.

Figure 9:
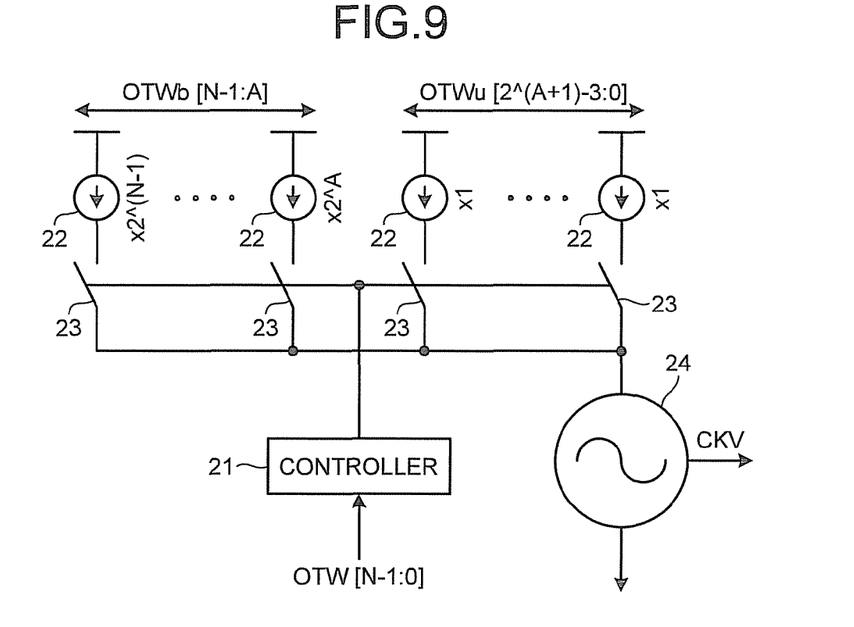
FIG. 9 is a diagram illustrating an example of the schematic configuration of a DCO according to a second embodiment.
Figure 10:
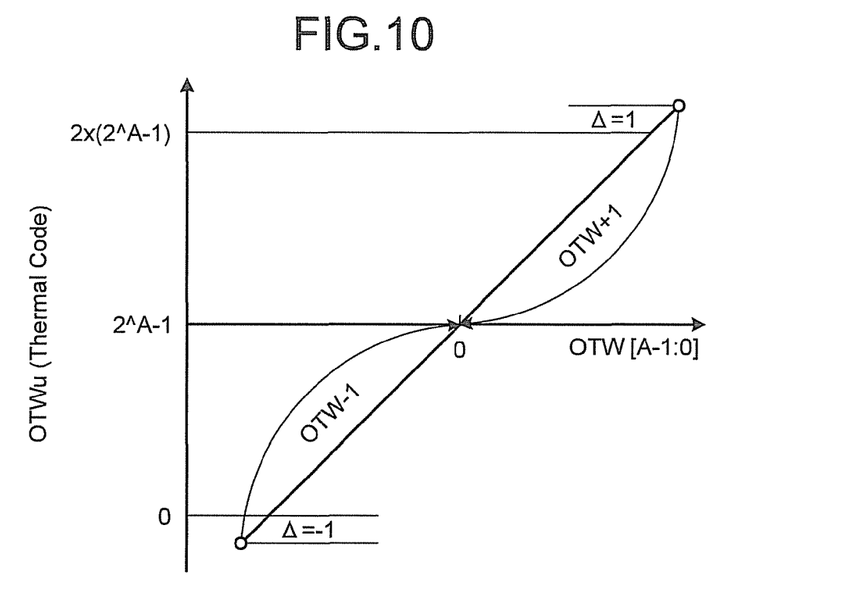
FIG. 10 is a diagram illustrating a correspondence relationship between OTW [A−1:0] and OTWu [2×(2^A−1):0]

Second Embodiment:

In the second embodiment, the case where control of the DCO 1 in the first embodiment is expanded to N bits will be described. FIG. 9 illustrates an example of the schematic configuration of the DCO 1 according to the second embodiment. FIG. 10 illustrates a correspondence relationship between OTW [A−1:0] and OTWu [2^(A+1)−3:0]. Since a basic control method is the same as that of the first embodiment, the description thereof will not be repeated.

As shown in FIG. 9, the DCO 1 includes a controller 21, plural switches 23, plural reference current sources 22, and an oscillator 24. The controller 21 divides OTW [N−1:0] of N bits into upper (N−A) (A≧1 and N>A) bits and lower A bits, and converts the upper (N−A) bits into a control signal OTWb [N−1:A] to perform Binary control of (N−A) bits and converts the lower A bits into OTWu [2^(A+1)−3:0] to perform Unary control of (2^(A+1)−2) bits.

The controller 21 calculates the difference of the previous OTW [N−1:0] and the current OTW [N−1:0]. In the case where the difference is positive, the controller 21 determines whether the addition result exceeds [2^(A+1)−2] when the difference is added to OTWu [2^(A+1)−3:0]. When it is determined that the addition result does not exceed [2^(A+1)−2], the controller 21 adds the difference to OTWu [2^(A+1)−3:0]. Meanwhile, when it is determined that the addition result exceeds [2^(A+1)−2], the controller 21 adds "1" to OTWu [N−1:A], sets OTWu [2^(A+1)−3:0]=2^A−1, and adds only a surplus to or subtracts only a surplus from OTWu [2^(A+1)−3:0].

Meanwhile, in the case where the difference is negative, the controller 21 determines whether the subtraction result becomes smaller than "0" when the difference is subtracted from OTWu [2^(A+1)−3:0]. When it is determined that the subtraction result does not become smaller than "0", the controller 21 subtracts the difference from OTWu [2^(A+1)−3:0]. When it is determined that the subtraction result becomes smaller than "0", the controller 21 subtracts "1"

from OTWu [N−1:A], sets OTWu [2^(A+1)−3:0]=2^A−1, and adds only a surplus to or subtracts only a surplus from OTWu [2^(A+1)−3:0].

According to the second embodiment, even when the DCO 1 is controlled with the N bits, the control method of the DCO 1 according to the first embodiment can be used.

Figure 11:
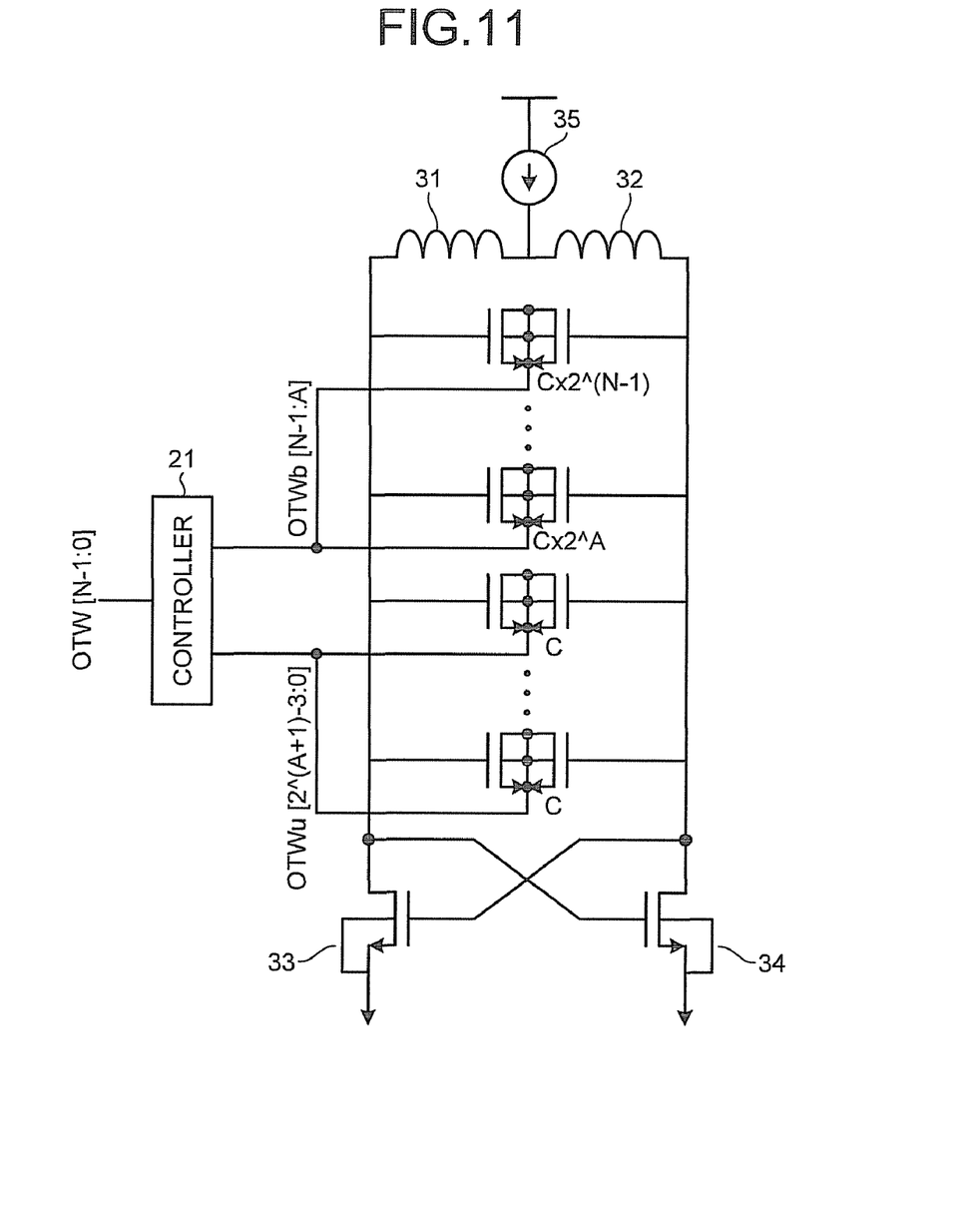
FIG. 11 is a diagram illustrating an example of the configuration of a DCO of a capacitive control type.

Third Embodiment:

In the DCO 1 according to the first and second embodiments, the switches that are connected to the constant current sources are switched using the oscillator of the current control type to control the current. However, the invention is not limited thereto, and the oscillator of the capacitive control type may be used. In a third embodiment, the case where the oscillator of the capacitive control type is used will be described. FIG. 11 illustrates an example of the configuration of the oscillator of the capacitive control type. Since a method that converts the OTW into the OTWb and the OTWu is the same as that of the second embodiment, the description thereof will not be repeated.

The DCO 1 has inductors 31 and 32, plural capacitors C×2^(N−1), ..., and C, nMOS transistors 33 and 34, and a current source 35. The capacitors C×2^(N−1), ..., and C are MOS-type capacitors that are connected in parallel. Each back-gate voltage of the capacitors C×2^(N−1), ..., and C is controlled by a value of each bit of OTWb [N−1:A] and OTWu [2^(A+1)−3:0].

For example, when one bit of OTWb [N−1:A] and OTWu [2^(A+1)−3:0] is 1, each back-gate voltage of the corresponding capacitors C×2^(N−1), ..., and C increases and each capacitance value increases. When one bit of OTWb [N−1:A] and OTWu [2^(A+1)−3:0] is 0, the combined capacitance of the corresponding capacitors C×2^(N−1), ..., and C is changed and the oscillation frequency of the DCO 1 can be changed.

According to a fourth embodiment, the oscillator is not limited to the oscillator of the current control type, and the control method according to the first and second embodiments can be used with respect to the oscillator of the capacitive control type.

As described above, according to the first to fourth embodiments, the ADPLL outputs an oscillation signal having an oscillation frequency according to an oscillator tuning word. The ADPLL includes the control unit 10 and the DCO 1. The control unit 10 divides the oscillator tuning word of N bits into upper (N−A) (A≧1 and N>A) bits and lower A bits, converts the upper (N−A) bits into a first code to perform Binary control of (N−A) bits and converts the lower A bits into a second code to perform Unary control of (2^(A+1)−2) bits, and outputs the conversion results, and the DCO 1 outputs oscillation signals having oscillation frequencies according to the first and second codes output from the control unit 10. Therefore, the noise that is generated by the frequency control can be reduced, the control lines can be reduced, and the consumption power and the mounting area can be reduced.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A digitally controlled oscillator that outputs an oscillation signal having an oscillation frequency according to an oscillator tuning word, comprising:
   a control unit that divides the oscillator tuning word of N bits into upper (N−A) (A≧1 and N>A) bits and lower A bits, converts the upper (N−A) bits into a first code to perform Binary control of (N−A) bits and converts the lower A bits into a second code to perform Unary control of (2^(A+1)−2) bits, and outputs the conversion results, wherein the second code is converted so that a shift probability of the first code can be decreased; and
   an oscillator that outputs oscillation signals having oscillation frequencies according to the first and second codes output from the controller.

2. The digitally controlled oscillator of claim 1,
   wherein the control unit calculates the difference of a current oscillator tuning word and a previous oscillator tuning word,
   in a case where the difference is positive, the control unit determines whether an addition result exceeds (2^(A+1)−2) when the difference is added to the Second code, and adds the difference to the second code when the addition result does not exceed (2^(A+1)−2), while the control unit adds "1" to the first code, sets the second code=2^A−1, and adds only a surplus to or subtracts only a surplus from the second code when the addition result exceeds (2^(A+1)−2), and
   in a case where the difference is negative, the control unit determines whether a subtraction result becomes smaller than "0" when the difference is subtracted from the second code, and subtracts the difference from the second code when the subtraction result does not become smaller than "0", while the control unit subtracts "1" from the first code, sets the second code=2^A−1, and adds only a surplus to or subtracts only a surplus from the second code when the subtraction result becomes smaller than "0".

3. The digitally controlled oscillator of claim 1, wherein the oscillator is a current control type.

4. The digitally controlled oscillator of claim 1, wherein the oscillator is a capacitive control type.

5. The digitally controlled oscillator of claim 1, wherein N is 8 and A is 3.

6. An oscillation method for a digitally controlled oscillator that outputs an oscillation signal having an oscillation frequency according to an oscillator tuning word, the method comprising:
   dividing the oscillator tuning word of N bits into upper (N−A) (A≧1 and N>A) bits and lower A bits;
   converting the upper (N−A) bits into a first code to perform Binary control of (N−A) bits and converting the lower A bits into a second code to perform Unary control of (2^(A+1)−2) bits, wherein the second code is converted so that a shift probability of the first code can be decreased; and
   outputting, by an oscillator, oscillation signals having oscillation frequencies according to the first and second codes.

7. The method of claim 6,
   wherein, at the converting, the difference of a current oscillator tuning word and a previous oscillator tuning word is calculated,
   in a case where the difference is positive, it is determined whether an addition result exceeds (2^(A+1)−2) when the difference is added to the second code, the difference is added to the second code when the addition result does not exceed $(2^{(A+1)}-2)$, while "1" is added to the first code, the second code=$2^A-1$ is set, and only a surplus is added to or is subtracted from the second code when the addition result exceeds $(2^{(A+1)}-2)$, and in a case where the difference is negative, it is determined whether a subtraction result becomes smaller than "0" when the difference is subtracted from the second code, the difference is subtracted from the second code when the subtraction result does not become smaller than "0", while "1" is subtracted from the first code, the second code=$2^A-1$ is set, and only a surplus is added to or is subtracted from the second code when the subtraction result becomes smaller than "0".

8. The method of claim 6, wherein the oscillator is a current control type.

9. The method of claim 6, wherein the oscillator is a capacitive control type.

10. The method of claim 6, wherein N is 8 and A is 3.

* * * * *